(12) United States Patent
Iwanaga et al.

(10) Patent No.: US 7,815,981 B2
(45) Date of Patent: Oct. 19, 2010

(54) GAS BARRIER FILM, SUBSTRATE FILM, AND ORGANIC ELECTROLUMINESCENCE DEVICE

(75) Inventors: Hiroshi Iwanaga, Minami-ashigara (JP); Seiya Sakurai, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 896 days.

(21) Appl. No.: 11/384,399

(22) Filed: Mar. 21, 2006

(65) Prior Publication Data
US 2006/0226517 A1 Oct. 12, 2006

(30) Foreign Application Priority Data
Mar. 22, 2005 (JP) .............................. 2005-082555

(51) Int. Cl.
*C09K 19/00* (2006.01)

(52) U.S. Cl. ...................... 428/1.26; 428/421; 428/213; 428/387; 428/215; 428/480; 428/1.1; 428/1.6; 349/56; 349/158; 525/437

(58) Field of Classification Search ................. 428/421, 428/427, 213, 387, 215, 480, 1.26, 1.1, 1.6; 349/56, 158; 525/437
See application file for complete search history.

(56) References Cited

U.S. PATENT DOCUMENTS

| | | | | |
|---|---|---|---|---|
| 3,096,879 A | * | 7/1963 | Schumacher | ................ 206/523 |
| 3,344,973 A | * | 10/1967 | Studen | ................ 206/523 |
| 4,430,493 A | | 2/1984 | Rieder | |
| 4,967,306 A | | 10/1990 | Hampi, Jr. et al. | |
| 5,770,301 A | * | 6/1998 | Murai et al. | ................ 428/213 |
| 5,853,862 A | * | 12/1998 | Murai et al. | ................ 428/215 |
| 5,888,593 A | * | 3/1999 | Petrmichl et al. | ............ 427/563 |
| 6,080,833 A | | 6/2000 | Otsuji et al. | |
| 6,136,444 A | * | 10/2000 | Kon et al. | ................ 428/423.1 |
| 6,268,695 B1 | | 7/2001 | Affinito | |
| 6,322,860 B1 | * | 11/2001 | Stein et al. | ................ 428/1.26 |
| 6,432,516 B1 | * | 8/2002 | Terasaki et al. | .......... 428/195.1 |
| 6,905,769 B2 | * | 6/2005 | Komada | ..................... 428/421 |
| 7,288,311 B2 | * | 10/2007 | Kawashima et al. | ........ 428/212 |
| 2001/0031379 A1 | | 10/2001 | Tera et al. | |
| 2002/0022156 A1 | | 2/2002 | Bright | |

(Continued)

FOREIGN PATENT DOCUMENTS

| | | |
|---|---|---|
| DE | 3434286 | 5/1985 |
| EP | 1205772 A2 * | 5/2002 |
| JP | 62-273531 A | 11/1987 |
| JP | 06-248063 A | 9/1994 |
| JP | 2000-500792 A | 1/2000 |

(Continued)

OTHER PUBLICATIONS

Office Action of Aug. 13, 2009 for U.S. Appl. No. 11/483,680.

(Continued)

*Primary Examiner*—Mark Ruthkosky
*Assistant Examiner*—Tamra L Amakwe
(74) *Attorney, Agent, or Firm*—Birch, Stewart, Kolasch & Birch, LLP (57) ABSTRACT

A gas barrier film comprising a gas barrier laminate on a substrate film, wherein the gas barrier laminate comprises at least one three-layer unit consisting of a silicon nitride layer, a silicon oxynitride layer adjacent to the silicon nitride layer, and a silicon nitride layer adjacent to the silicon oxynitride layer. The gas barrier film has excellent transparency and gas barrier property.

12 Claims, 2 Drawing Sheets

U.S. PATENT DOCUMENTS

| | | | |
|---|---|---|---|
| 2002/0102367 A1 | 8/2002 | Shimodaira et al. | |
| 2003/0120008 A1 | 6/2003 | Obayashi et al. | |
| 2004/0052975 A1* | 3/2004 | Komada et al. | 427/574 |
| 2005/0203257 A1* | 9/2005 | Uchida et al. | 525/437 |
| 2006/0093758 A1* | 5/2006 | Sakakura et al. | 428/1.6 |

FOREIGN PATENT DOCUMENTS

| | | |
|---|---|---|
| JP | 2000-227603 A | 8/2000 |
| JP | 2001-150584 A | 6/2001 |
| JP | 2002-220564 A | 8/2002 |
| JP | 2003-053881 | 2/2003 |
| WO | WO-97/14739 A1 | 4/1997 |

OTHER PUBLICATIONS

Office Action of Mar. 11, 2009 for U.S. Appl. No. 11/483,680.
Office Action of Aug. 3, 2009 for U.S. Appl. No. 11/727,380.
Office Action of Mar. 12, 2009 for U.S. Appl. No. 11/727,380.
Office Action of Mar. 11, 2009 for U.S. Appl. No. 11/401,217.
Office Action of Oct. 21, 2009 for U.S. Appl. No. 11/401,217.
Office Action of Jul. 13, 2009 for U.S. Appl. No. 12/004,036.
Office Action of Mar. 2, 2009 for U.S. Appl. No. 12/004,036.
Office Action of Aug. 7, 2008 for U.S. Appl. No. 12/004,036.
Office Action of May 13, 2009 for U.S. Appl. No. 12/004,036.
Office Action of Jun. 20, 2008 for U.S. Appl. No. 11/088,988.
Office Action of Dec. 2, 2008 for U.S. Appl. No. 11/088,988.
Derwent Publications Ltd., London, GB AN 2005-762358, XP002443737.
Derwent Publications Ltd., London, GB AN 2006-168119 XP002443732.

* cited by examiner

GAS BARRIER FILM, SUBSTRATE FILM, AND ORGANIC ELECTROLUMINESCENCE DEVICE

BACKGROUND OF THE INVENTION

1. Field of the Invention

The present invention relates to a gas barrier film and, more specifically, it relates to a laminate type gas barrier film suitable to substrates for various kinds of devices and coating films for the devices. Further, the invention also relates to an organic electroluminescence device excellent in durability and flexibility obtained by using the gas barrier film (referred to hereinafter as an EL device).

2. Description of the Related Art

Gas barrier films in which thin films of metal oxide such as aluminum oxide, magnesium oxide, and silicon oxides are formed on the surfaces of plastic substrates or films have been generally used so far for packaging of articles requiring shielding of steams or various gases such as oxygen, or packaging application for preventing denaturation of foodstuffs, industrial products, and medicines. Further, the gas barrier films have also been started for use in substrates of liquid crystal display devices, solar cells, electroluminescence (EL) devices or the like in addition to the packaging use. Particularly, in transparent substrates which have been applied progressively to liquid crystal display devices, EL devices, etc., high level of demands such as long time reliability, high degree of freedom in view of shape, and capability of display on a curved surface have been required in addition to the demand for reduction in the weight and increase in the size.

Recently, in the field of the liquid crystal display devices, the EL devices, etc., film substrates such as made of transparent plastics have been started for use instead of glass substrates, which are heavy, tended to be cracked and difficult in increasing the area. Further, since the film substrates such as made of transparent plastics not only can cope with the requirements described above but also can be applied to the roll-to-roll system, they are advantageous over glass materials in view of the productivity and the reduction of cost. However, film substrates such as of transparent plastics involve a problem of poor gas barrier property in comparison with glass. Since steam or air permeates in a case of a substrate of poor gas barrier property, when it is used for example to a liquid crystal display device, liquid crystals in a liquid crystal cell are deteriorated and deteriorated portions result in display defects to deteriorate the display quality, For solving such problems, it has been known to form a thin film of a metal oxide on the film substrate described above, and use the gas barrier film as a transparent substrate. As gas barrier films used for packaging materials and liquid crystal display devices, those formed by vapor depositing silicon oxide on a plastic film (for example, in JP-B No. 53-12953 (p1 to p3) and those formed by vapor depositing aluminum oxide (for example, in JP-A No. 58-217344 (p1 to p4) are known and they have a steam barrier property of about 1 g/m$^2$/day. However, the steam barrier property as low as about 0.1 g/m$^2$/day has been demanded recently for the film substrate along with increase in the size of liquid crystal displays or development for highly fine displays.

Further, most recently, development has been progressed, for example, in organic EL displays or highly fine color liquid crystal displays requiring further higher barrier property and it has been demanded for a substrate having a performance of higher barrier property, particularly, a steam barrier property of less than 0.1 g/m$^2$/day while maintaining transparency usable therein.

For coping with such a demand, film deposition by way of a sputtering method or a CVD method of forming a thin film using plasmas generated by glow discharge under low pressure conditions has been studied as means capable of expecting highly barrier performance. Further, it has been attempted to obtain desired performance by lamination structure (for example, in JP-A No. 2003-206361 (p2-p3)).

As a thin film material of excellent barrier property, silicon nitride and silicon oxynitride have also been utilized and lamination of them has also been attempted (for example, in JP-A No. 2003-206361 (p2-p3)).

However, in a case of using the film substrate, since restriction is imposed on the substrate temperature during film formation, a barrier layer of a sufficiently dense structure can not be formed, and a film having a barrier property enough to satisfy the requirement has not yet been manufactured.

On the other hand, it has been proposed a technique of preparing a barrier film having an alternate laminate structure of organic layer/inorganic layer by a vacuum vapor deposition method (for example, refer to U.S. Pat. No. 6,413,645B1 (p4, [2-54] to p8, [8-22])) and "Thin Solid films" written by Affinito, et al., (1996), p. 290 to p291 (p63 to p67)), a film having a barrier property required for the organic EL film substrate has been obtained.

However, in a case of continuously forming the films for the organic layer and the inorganic layer, it gives rise to a problem such as contamination between both of the process, and it is necessary to form a multi-layered structure of at least six or more layers in order to provide a barrier film of high reliability for use in organic EL devices. Since it has been difficult to make the performance and the high throughput compatible, it has been demanded for developing a new film forming system suitable to continuous film forming process.

SUMMARY OF THE INVENTION

For overcoming the foregoing problems, the object of the present invention is to provide a film of high gas barrier property having high productivity suitable to continuous film formation and, further, to provide an organic EL device having high durability, and excellent in flexibility free of deterioration of image quality even during long time use.

The present inventor, as a result of an earnest study, has found that the object can be attained by (1) to (11) below:

(1) A gas barrier film comprising a gas barrier laminate on a substrate film, wherein the gas barrier laminate comprises at least one three-layer unit consisting of a silicon nitride layer, a silicon oxynitride layer adjacent to the silicon nitride layer, and a silicon nitride layer adjacent to the silicon oxynitride layer.

(2) A gas barrier film described in (1), wherein the steam permeability at 40° C. and 90% relative humidity is 0.01 g/m$^2$/day or less.

(3) A gas barrier film described in (1) or (2), wherein the substrate film is formed of a polymeric material having a glass transition temperature of 120° C. or higher.

(4) A gas barrier film described in any one of (1) to (3), wherein at least one of the silicon nitride layers is formed by using inductively-coupled plasma CVD.

(5) A gas barrier film described in any one of (1) to (4), wherein the silicon oxynitride layer has a constitutional ratio between oxygen and nitrogen of 1:1 to 20:1, and a refractive index of from 1.4 to 2.0.

(6) A gas barrier film described in any one of (1) to (5), wherein the substrate film is a film comprising a polymer having the structure represented by the following formula (1) or a film comprising a polymer having the structure represented by the following formula (2):

Formula (1)

wherein a ring α represents a mononuclear or polynuclear ring and two rings α may be identical or different with each other and are bonded by spiro bonding, Formula (2)

wherein a ring β and a ring γ each represents a mononuclear or polynuclear ring, two rings γ may be identical or different with each other and connected to one quaternary carbon on the ring β.

(7) A gas barrier film described in any one of (1) to (6), wherein a transparent conductive layer is disposed on the gas barrier laminate.

(8) A gas barrier film described in any one of (1) to (7), manufactured by a method of supplying the substrate film in a roll-to-roll system and forming the gas barrier laminate continuously.

(9) A substrate film for use in an image display device using a gas barrier film described in any one of (1) to (8).

(10) An organic electroluminescence device using a substrate film for use in an image display device described in (9).

(11) An organic electroluminescence device manufactured by forming the film of the organic electroluminescence device described in (10), then disposing on the film at lest one three-layer unit consisting of a silicon nitride layer, a silicon oxy nitride layer adjacent to the silicon nitride layer, and a silicon nitride layer adjacent to the silicon oxy nitride layer in vacuum without exposing to atmospheric air, and then sealing them.

According to the invention, a film having a high gas barrier property can be provided by a manufacturing method having high productivity suitable to continuous film formation. Further, the invention can provide an organic EL device free of degradation of image quality even during long time use, having high durability and excellent in flexibility.

BEST MODE FOR CARRYING OUT THE INVENTION

The barrier film according to the present invention is to be described specifically. Explanation for the constituent factors to be described later are sometimes based on typical embodiments of the invention but the invention is not restricted to such embodiments. In the specification, ranges for numeral values represented by "- - - - to - - - " means ranges including numeral values described before and after "to" as the lower limit value and the upper limit value respectively.

<Gas Barrier Film>

In the gas barrier film according to the invention, a gas barrier laminate formed on the substrate film comprises at least one three-layer unit consisting of a silicon nitride layer, a silicon oxynitride layer adjacent to the silicon nitride layer, and a silicon nitride layer adjacent to the silicon oxynitride layer. The silicon nitride layer referred to herein means a layer comprising silicon nitride as a main ingredient and the silicon oxynitride layer means a layer comprising silicon oxynitride as a main ingredient. The main ingredient referred to herein means such an ingredient that the total of the elements of silicon and nitrogen for the silicon nitride layer, or the total of the elements of silicon, nitrogen, and oxygen for the silicon oxynitride layer is, preferably, 90 mass % or more, more preferably, 95 mass % or more and, further preferably, 98 mass % or more based on the total elements constituting the entire layer. The gas barrier film of the invention can be optionally provided further with an organic layer or a functional layer such as a protective layer, a hygroscopic layer, an antistatic layer, etc.

(Gas Barrier Layer)

The silicon nitride contained in the silicon nitride layer means a composition in which the main constituent element comprises silicon and nitrogen. It is preferred that each of other constituent elements than described above such as small amount of oxygen, hydrogen, carbon, etc. intruded from the starting material for forming the film, the substrate, atmospheric air, etc. is less than 5%. The constituent ratio for silicon and nitrogen constituting the silicon nitride in the invention represented by the compositional formula: $Si_3N_x$ is preferably: x=3.15 to 4.00. At x=3.15 or more, the film is less colored and the gas barrier property can be ensured. Preferably, x=3.50 to 4.00 and, most preferably, x=4.00 which is a stoichiometrical compositional ratio.

Two silicon nitride layers sandwiching the silicon oxynitride layer in the invention may be of an identical composition or composition different from each other so long as the main ingredient is silicon nitride.

Silicon oxynitride in the invention means a composition in which the main constituent elements comprise silicon, nitrogen, and oxygen. It is preferred that each of other constituent elements than described above such as a small amount of hydrogen, carbon, etc. intruded from the starting material for forming the film, a substrate, atmospheric air, etc. is less than 10%. The constituent ratio for oxygen and nitrogen constituting the silicon oxynitride in the invention is, preferably, from 1:1 to 20:1, preferably, from 1:1 to 10:1 and, further preferably, from 2:1 to 4:1. The constituent ratio for silicon, oxygen, and nitrogen constituting the silicon oxynitride in the invention represented by the compositional formula: $Si_yO_zN_w$ is preferably: $3.15 < r \leq 4.0$ and z/w=1 to 20 assuming r=(2z+3w)/y. At r=3.15 or more, the film is less colored and a gas barrier property can be ensured easily. At z/W of 1 or more, since the barrier layer less fluctuates by deformation or impact or the substrate less warps, the range for the application use of the gas barrier film is extended. At z/w of 20 or less, since the inter-layer adhesion with respect to the adjacent silicon nitride layer is favorable and, further, the film is less peeled, reliability as the gas barrier film is enhanced.

The elemental constitutional ratio of the laminate sample of the invention can be measured by a known standard method according to X-ray photoelectron spectroscopy (XPS) while etching.

The refractive index for each of the layers can be measured by a known standard method according to spectral ellipsometry. The refractive index of the silicon oxynitride layer situated between the two silicon nitride layers is, preferably, from 1.4 to 2.0, more preferably, from 1.45 to 1.8 and, particularly preferably, from 1.5 to 1.6 in order to ensure a high gas barrier performance.

The refractive index of the two silicon nitride layers gives no significant effect on the gas barrier performance and it does not restrict the invention and it is preferred that the refractive index for each of them is within a range from 1.7 to 2.2. A gas barrier performance can be readily ensured at a refractive index of 1.7 or higher and the application range of the gas barrier film is extended at a refractive index of 2.2 or lower since absorption in a visible range is weak.

For the method of forming the gas barrier layer of the invention, any method can be used so long as an aimed thin film can be formed. For example, a sputtering method, a vacuum vapor deposition method, an ion plating method, or a plasma CVD method is suitable and, specifically, formation methods described in each of JP No. 3400324, JP-A Nos. 2002-322561, and 2002-361774 can be adopted.

The steam permeability of the gas barrier film of the invention at 40° C. and 90% relative humidity is, preferably, 0.1 $g/m^2/day$ or less, more preferably, 0.05 $g/m^2/day$ or less and, particularly preferably, 0.01 $g/m^2/day$ or less while this depends on the application use.

For manufacturing a gas barrier film having a high barrier property with a steam permeability of 0.01 $g/m^2/day$ or less at 40° C. and 90% relative humidity, it is preferred to adopt any of the forming methods of an inductively-coupled plasma CVD, or PDV or CVD using plasmas with application of microwaves and magnetic fields set to the electron cyclotron resonance condition is preferred, and the use of the formation method according to the inductively-coupled plasma CVD is most preferred. The inductively-coupled plasma CVD or CVD using plasmas with application of microwaves and magnetic fields set to the electron cyclotron resonance condition (ECR-CVD) can be practiced according to the method as described, for example in, CVD Handbook, p. 284 (1991) by Chemical Engineering Society. Further, PVD using plasmas with application of microwaves and magnetic fields set to the electron cyclotron resonance condition (ECR-PVD) can be practiced for example by the method described by Ono, et al. in Jpn. J. Appl. Phys. 23, No. 8, L534 (1984).

As the starting material for forming the silicon nitride in a case of using CVD, a gas source such as a silicon halide typically represented by silane or dichlorosilane or a liquid source such as hexamethyl disilazane as a silicon supply source can be used. As a nitrogen supply source, a gas source such as nitrogen or ammonia or a liquid source such as hexamethyl disilazane can be used.

For providing high barrier performance, combination of a silane gas of high reactivity and nitrogen is most preferred.

Generally, when a substrate film is put in a vacuum vessel, water, residual solvents, surface adsorption ingredients, or trace amounts of low molecular residual ingredients are released from the film surface. For forming a gas barrier layer of a dense structure, it is preferred to decrease the releasing ingredients. Specifically, a pre-treatment of introducing the film into the vacuum vessel before film formation or preheating the film to remove the releasing ingredients is effective. In this regard, use of a highly heat resistant substrate is effective.

Further, in a case of using a highly heat resistant substrate, the substrate can be heated upon formation of the gas barrier layer or transparent conductive layer and since this promotes re-arrangement of the molecules or atoms during film formation, a gas barrier film and a transparent conductive film having gas barrier property at higher quality can be obtained.

As the starting material for forming the silicon oxynitride in a case of using CVD, a gas source such as a silicon halide typically represented by silane or dichlorosilane or a liquid source such as hexamethyl disilazene can be used as the silicon supply source. As the supply source for nitrogen and oxygen, a gas source such as nitrogen, ammonia, and dinitrogen monoxide, hexamethyl disilazane (HMDSN), tetraethoxysilane (TEOS), trimethoxysilane (TMS), etc. can be used in combination. Use of silane gas, nitrogen, and oxygen in combination is preferred with a reason of inter-layer adhesion or less intrusion of the impurity during continuous processing.

While the thickness of the gas barrier layer is not particularly limited, the substrate may possibly cause warping, deformation, etc. along with occurrence of cracks or increase of internal stress due to bending stress in a case where the thickness is excessively large, or the film distributes in an island-shape in a case where it is excessively thin for each of the layers, so that the steam barrier property tends to be worsened in each of the cases. This trends particularly develops remarkably in the silicon oxynitride layer.

Accordingly, the thickness of the silicon nitride layer is within a range, preferably, from 20 to 500 nm, more preferably, 50 nm to 200 nm, most preferably, at 100 nm. Each of two or more silicon nitride layers may have an identical film thickness or have different compositions, which is not particularly limited so long as this is within the range described above.

It is preferred that the thickness of the silicon oxynitride layer is larger than that of the adjacent two silicon nitride layers and it is desirably within a range from 100 to 1,000 nm. At a thickness of 100 nm or less, sufficient barrier property is no more developed for the entire laminate. At a thickness of 1,000 nm or more, the silicon nitride layer, particularly, adjacent on the external side tends to be fractured and sufficient barrier property can no more be obtained for the entire laminate also in this case.

With an aim of enhancing the reliability, a silicon oxynitride layer, silicon nitride layer, etc. may further be laminated to the continuous silicon nitride layer•silicon oxynitride layer•silicon nitride layer of the invention. However, also in this case, the total thickness of the layer thickness does not preferably exceed 1500 nm.

It is a well-known technique in the relevant field to control optimal optical characteristics by determining the refractive index of each of the layers and controlling the effect caused by the optical interference of the inter-layer reflection light in the laminate film by controlling the thickness for each of the layers. It will be apparent that the characteristics can be controlled without degrading the barrier performance.

A desired functional layer can be disposed optionally between the gas barrier laminate and the substrate film, and/or to the outside of the gas barrier laminate and at the back surface of the substrate film. An example of the functional layer disposed between the gas barrier laminate and the substrate film includes a smoothing layer, an adhesion improving layer, a light shielding layer including a black matrix, an anti-reflection layer, etc. It may also be a thin inorganic film layer formed by a CVD or PVD method, or it may be a layer formed by forming a UV-ray or electron beam curable monomer, oligomer or resin by coating or vapor deposition and then curing the same by UV-rays or electron beams.

In the same manner, a known functional layer may also be disposed to the outside and/or inside of the gas barrier laminate as viewed on the side of the substrate. As the example of the functional layer, known functional layers such as a protective film for providing scratch resistance, an anti-hauling layer, an anti-static layer, an anti-reflective layer, an anti-dazzling layer, an anti-adhesion layer, a hygroscopic layer, a solvent resistance layer, a color filter can be used.

Particularly, it is effective to dispose a transparent conductive layer such as of ITO or IZO to the outermost layer of the gas barrier film according to the invention for utilizing as the substrate for the electron device. For the transparent conductive layer, known vacuum film forming method such as a sputtering method or ion plating method or coating method utilizing sol-gel method can be utilized and a vacuum film forming method of continuously forming the film without returning the pressure to the atmospheric pressure upon formation of the gas barrier laminate is advantageous with the view point of the manufacturing cost, and ensurance of reliability and inter-layer adhesion.

Further, since the gas barrier film is excellent in the bending resistance, it can be formed continuously into a film by a roll-to-roll method. Further, since the composition in each of the layers is similar, it is not necessary to strictly partition the film forming area between each of the layers and it less suffers from degradation of the performance by contamination, so that it has a merit capable of easily obtaining the advantage particularly of the roll-to-roll method because of the production cost, reliability and simplification of maintenance.

Further, a different or identical substrate film may be used being superposed on the gas barrier substrate of the invention by a method by way of a heat sealing material with an aim of protection.

(Substrate Film)

The substrate film to be used for the gas barrier film of the invention is not particularly restricted so long as it is a film capable of maintaining each of the layers, and can be optionally selected in accordance with the use. The substrate film specifically includes, for example, thermoplastic resins such as polyester resin, methacrylic resin, methacrylic acid-maleic acid copolymer, polystyrene, transparent fluoro-resin, polyimide resin, fluorinated polyimide resin, polyamide resin, polyamideimide resin, polyether imide resin, cellulose acylate resin, polyurethane resin, polyether ether ketone resin, polycarbonate resin, cycloaliphatic polyolefin resin, polyarylate resin, polyether sulfone resin, polysulfone resin, cycloolefine copolymer, fluolene ring-modified carbonate resin, cycloaliphatic modified polycarconate resin, and acryloyl compound. Among the resins, resins having a Tg of 120° C. or higher are preferred, and specific examples include films comprising a compound such as polyester resins, particularly, polyethyl naphthalate resin (PEN: 121° C.), polyarylate resin (PAr: 210° C.), polyether sulfone resin (PES: 220° C.), fluolene ring-modified carbonate resin (BCF-PC: a compound of Example 4 in JP-A 2000-227603: 225° C.), cycloaliphatic-modified polycarbonate resin (a compound of Example 5 in JP-A No. 2000-227603: 205° C.), or an acryloyl compound (a compound of Example-1 in JP-A No. 2002-80616: 300° C. or higher), etc. (the number in each parenthesis represents Tg).

The present inventor has found that the constitution is particularly effective in a case when Tg of the substrate film is 120° C. or higher. Particularly, in a case of forming a film of silicon nitride by an inductively-coupled plasma CVD, when the highest temperature in the process is monitored by adhering a thermo-tape on the surface of the substrate, it is observed to be 50° C. or lower and in a case where a film is formed on a resin substrate having different Tg value under utterly the same condition, the barrier performance is extremely enhanced at Tg of about 100° C., and it is remarkably improved at Tg of 120° C. or higher. Although the reason has not been analyzed sufficiently yet, it is estimated that this gives some effect on the state of the extreme surface that can not be detected by the thermo-tape.

The barrier property is preferred at 120° C. or higher, more preferred at 200° C., further preferred, at 250° C. or higher of Tg.

Further, as the compound constituting the substrate film, a resin having a spiro structure represented by the following formula (1) or a resin having a cardo-structure represented by the following formula (2) is preferred.

Formula (1)

In the above formula, a ring α represents a mononuclear or polynuclear ring and two rings may be identical or different with each other and are bonded by spiro bonding.

Formula (2)

In the above formula, a ring β and a ring γ each represents a mononuclear or polynuclear ring, two rings γ may be identical or different with each other and the ring β and the ring γ are connected to one quaternary carbon on the ring β.s Since the resin represented by the formula (1) or (2) is a compound having high heat resistance, high modulus of elasticity and high tensile stress at break, it can be used suitably as a substrate material such as for organic EL devices which are required for various kinds of heating operations in the production process and also required for less fracturing performance even upon bending.

Examples of the ring a in the formula (1) include indane ring, chroman ring, 2,3-dihydrobenzofuran ring, indoline ring, tetrahydropyran ring, tetrahydrofuran ring, dioxane ring, cyclohexane ring, cyclopentane ring, etc. Examples of the ring β in the formula (2) include a fluolene ring, indanedione ring, indanone ring, indene ring, indane ring, tetralone ring, anthrone ring, cyclohexane ring, cyclopentane ring, etc. The ring γ in the formula (2) includes, for example, benzene ring, naphthalene ring, anthracene ring, fluolene ring, cyclohexane ring, cyclopentane ring, pyridine ring, furan ring, benzofuran ring, thiophene ring, benzothiophene ring, benzothiazole ring, indane ring, chroman ring, indole ring, and α-pyrone ring.

Preferred examples of the resin having a spiro structure represented by the formula (1) includes a polymer containing a spirobiindane structure represented by the following formula (3) in the repetitive units, a polymer containing a spirobichromane structure represented by the formula (4) in the recurring units, and a polymer containing a spirobibenzofuran structure represented by the formula (5) in the recurring units.

Formula (3)

In the formula (3), $R^{31}$ and $R^{32}$ each independently represents a hydrogen atom or a substituent. $R^{33}$ represents a substituent. Further, each of $R^{31}$, $R^{32}$ and $R^{33}$ may bond to form a ring. m and n each independently represents an integer of from 0 to 3. Preferred examples of the substituent include a halogen atom, alkyl group, and aryl group. Further preferably, $R^{31}$ and $R^{32}$ each independently represents a hydrogen atom, methyl group, or phenyl group. Further preferably, $R^{33}$ represents a chlorine atom, bromine atom, methyl group, isopropyl group, tert-butyl group, or phenyl group.

Formula (4)

In the formula (4), $R^{41}$ represents a hydrogen atom or a substituent. $R^{42}$ represents a substituent. Further, each of $R^{41}$ and $R^{42}$ may bond to form a ring. m and n each independently represents an integer of from 0 to 3. Preferred examples of the substituent include a halogen atom, alkyl group, and aryl group. $R^{41}$ represents, further preferably, a hydrogen atom, methyl group, or phenyl group. $R^{42}$ represents, further preferably, a chlorine atom, bromine atom, methyl group, isopropyl group, tert-butyl group, or phenyl group.

Formula (5)

In the formula (5), $R^{51}$ represents a hydrogen atom or a substituent. $R^{52}$ represents a substituent. Further, each of $R^{51}$ and $R^{52}$ may bond to form a ring. m and n each independently represents an integer of from 0 to 3. Preferred examples of the substituent include a halogen atom, alkyl group, and aryl group. $R^{51}$ represents, further preferably, a hydrogen atom, methyl group, or phenyl group. $R^{52}$ represents, preferably, a chlorine atom, bromine atom, methyl group, isopropyl group, tert-butyl group or phenyl group.

The ring β in the formula (2) includes, for example, fluorene 1,4-bibenzocyclohexane, and the ring γ includes, for example, phenylene, and naphthalene. The preferred examples of the resin having a cardo-structure represented by the formula (2) include a polymer containing a fluolene structure represented by the formula (6) in the recurring units.

Formula (6)

In the formula (6), $R^{61}$ and $R^{62}$ each independently represents a substituent. Further, each of $R^{51}$ and $R^{52}$ may bond to form a ring. j and k each independently represents an integer of from 0 to 4. Preferred examples of the substituent include a halogen atom, alkyl group, and aryl group. Further preferably, $R^{51}$ and $R^{52}$ each independently represents a chlorine atom, bromine atom, methyl group, isopropyl group, tert-butyl group, or phenyl group.

The resin containing the structure represented by the formulas (3) to (6) in the recurring units may be a polymer which is bonded by various bonding systems such as a polycarbonate, polyester, polyamide, polyimide, or polyurethane, and it is, preferably, a polycarbonate, polyester or polyurethane induced from a bisphenol compound having a structure represented by the formulae (3) to (6).

Preferred specific examples of the resin having a structure represented by the formula (1) or the formula (2) (resin compounds (I-1) to (FL-11)) are described below. However, the resins which can be used in the invention are not restricted to them. Compounds FL-1 to FL-6 below are copolymers of isophthaloyl and terephthaloyl (50/50 mol %).

I-1

I-2

I-3

I-4

I-5

I-6 I-7

F-1 F-2

F-3

F-4 F-5

H-1 H-2

-continued

H-3

H-4

H-5

H-7

H-8

FL-1

FL-2

FL-3

FL-4

FL-5

FL-6

FL-7

-continued

FL-8

FL-9

FL-11

FL-10 Copolymer of FL-8 and FL-9 (80/20 mol %)
FL-12 Copolymer of FL-7 and FL-11 (80/20 mol %)

The resins having a structure represented by the formula (1) and the formula (2) which can be used for the substrate film of the invention may be used alone, or may be used in admixture of several kinds of them. Further, they may be a homopolymer, or a copolymer of plural kinds of structures in combination. In a case of the resin of a copolymer, known recurring units not containing the structure represented by the formula (1) or (2) in the recurring units may be copolymerized within a range not impairing the effects of the invention. Preferably, the resin comprises a copolymer since it is superior to a case of using a resin as a homopolymer with a view point of solubility and transparency.

A preferred molecular weight, on the basis of a weight average molecular weight, of the resin having the structures represented by the formulas (1) and (2) which can be used in the invention is preferably from 10,000 to 500,000, preferably, from 20,000 to 300,000, and particularly preferably from 30,000 to 200,000. In a case where the molecular weight of the resin is excessively low, film formation tends to be difficult and dynamic characteristics are sometimes deteriorated. On the contrary, in the case where the molecular weight is excessively high, the molecular weight is difficult to be controlled in view of synthesis, and the handling of the solution is sometimes difficult because of its excessively high viscosity. The molecular weight can be roughly determined on the viscosity corresponding thereto.

It is preferred that the substrate film for use in the invention is does not up take water in view of the nature. That is, it is preferably formed of a resin having no hydrogen bonding functional group. The equilibrium water content of the substrate film is, preferably, from 0.5 mass % or lower, further preferably, 0.1 mass % or lower and particularly, preferably, 0.05 mass % or less.

In a case of using a substrate film having a low equilibrium water content, electrostatic charging of the substrate film tends to occur. The electrostatic charging of the substrate film is an undesirable phenomenon since this causes adsorptive of particles to impair the properties of the barrier layer, or causes handling failure due to bonding. Therefore, in order to solve the foregoing problems, it is preferred that an antistatic layer is disposed on the surface of the substrate film in adjacent therewith.

The antistatic layer referred to herein is a layer in which the surface resistivity at 50° C. and 30% relative humidity is 1 $\Omega/\square$ to $10^{13}$ $\Omega/\square$. The surface resistivity of the antistatic layer at 50° C. and 30% relative humidity is, preferably, from $1 \times 10^8$ $\Omega/\square$ to $1 \times 10^{13}$ $\Omega/\square$, more preferably, from $1 \times 10^8$ $\Omega/\square$ to $1 \times 10^{11}$ $\Omega/\square$ and, particularly preferably, from $1 \times 10^8$ $\Omega/\square$ to $1 \times 10^9$ $\Omega/\square$.

<Image Display Device>

While the application use of the gas barrier film of the invention is not particularly limited, since it is excellent in the optical characteristics and mechanical characteristics, it can be used suitably as a substrate for use in transparent electrodes of an image display device. "Image display device" referred to herein means a circular polarization plate, a liquid crystal display device, a touch panel, an organic EL device, etc.

<Circular Polarization Plate>

The circular polarization plate can be manufactured by laminating a λ/4 plate and a polarization plate on the gas barrier film of the invention. In this case, they are laminated such that the phase delay axis of the λ/4 plate and the absorption axis of the polarization plate form an angle of 45°. A polarization plate stretched in 45° direction relative to the longitudinal direction (MD) is used preferably and, those, for example, disclosed in JP-A No. 2002-865554 can be used suitably.

<Liquid Crystal Display Device>

A liquid crystal display device is generally classified into a reflection type liquid crystal display device and a transmission type liquid crystal display device.

The reflection type liquid crystal display device has a lower substrate, a reflection electrode, a lower orientation film, a liquid crystal layer, an upper orientation film, a transparent electrode, an upper substrate, a λ/4 plate, and a polarization film orderly from below. The gas barrier film of the invention can be used as the transparent electrode and the upper substrate. In a case of providing the reflection type liquid crystal display device with a color display function, a color filter layer is preferably situated further between the reflection electrode and the lower orientation film, or between the upper orientation film and the transparent electrode.

Further, the transmission type liquid crystal display device has a back light, a polarization plate, a λ/4 plate, a lower transparent electrode, a lower orientation film, a liquid crystal layer, an upper orientation film, an upper transparent electrode, an upper substrate, a λ/4 plate, and a polarization film orderly from below. Among them, the gas barrier film of the invention can be used as the upper transparent electrode and the upper substrate. Further, in a case of providing the transmission type liquid crystal display device with the color display function, it is preferred that a color filter layer is preferably situated further between the lower transparent electrode and the lower orientation film, or between the upper orientation film and the transparent electrode.

While the structure of liquid crystal layer is not particularly limited, it is, preferably, for example, a TN (Twisted Nematic) type, an STN (Supper Twisted Nematic) type a HAN (Hybrid Aligned Nematic) type, a VA (Vertically Alignment) type, an ECB (Electrically Controlled Birefringence) type, an OCB (Optically Compensatory Bend) type, or a CPA (Continuous Pinwheel Alignment) type.

<Touch Panel>

As the tough panel, those applying the gas barrier film of the invention to the substrate described, for example, in JP-A Nos. 5-127822 and 2002-48913 can be used.

<Organic EL Device>

The organic EL device has a cathode and an anode on a gas barrier film of the invention and has an organic compound layer containing an organic light emitting layer (hereinafter sometimes simply referred to as "light emitting layer") between both of the electrodes. In view of the property of the light emitting device, at least one of the anode and the cathode is preferably transparent.

As the mode of the lamination of the organic compound layer in the invention, it is preferred such a mode where a hole transporting layer, a light emitting layer, and an electron transporting layer are laminated in this order from the side of the anode. Further, a charge blocking layer or the like may be present between the hole transporting layer and the light emitting layer or between the light emitting layer and the electron transporting layer. A hole injecting layer may be provided between the anode and the hole transporting layer and an electron injecting layer may be present between the cathode and the electron transporting layer. The light emitting layer may consist of only one layer or the light emitting layer may be divided into a first light emitting layer, a second light emitting layer, a third light emitting layer, etc. Each of the layers may be divided into a plurality of secondary layers.

Constituent factors for an organic EL device of the invention is to be described specifically.

(Anode)

It may usually suffice that the anode has a function as an electrode for supplying holes to the organic compound layer and the shape, structure, size, etc. thereof are not particularly limited and can be selected properly from known electrode materials in accordance with the application use and the purpose of the light emitting device. As described above, the anode is formed usually as a transparent anode.

The material for the anode includes preferably, for example, metals, alloys, metal oxides, conductive compounds or mixtures of them. Specific examples of the anode material include conductive metal oxides such as tin oxide doped with antimony, fluorine, etc. (ATO, FTO), tin oxide, zinc oxide, indium oxide, indium tin oxide (ITO), and indium zinc oxide (IZO), metals such as gold, silver, chromium, and nickel, as well as mixtures or laminates of such metals with conductive metal oxides, inorganic conductive materials such as copper iodide, and copper sulfide, organic conductive materials such as polyaniline, polythiophene and polypyrrole, and laminates thereof with ITO. Among them, preferred are conductive metal oxides, and ITO is particularly preferred with a view point of productivity, high conductivity, transparency, etc.

The anode can be formed on the substrate in accordance with a method selected properly, for example, from wet method such as a printing method and a coating method, physical method such as a vacuum vapor deposition method, a sputtering method, and an ion plating method, and chemical method such as CVD or plasma CVD while considering the adaptability with the material constituting the anode. For example, in a case of selecting ITO as the material for the anode, the anode can be formed in accordance with a DC or RF sputtering method, a vacuum deposition method, an ion plating method, etc.

In the organic EL device of the invention, the position for forming the anode is not particularly limited and can be selected properly in accordance with the application use and the purpose of the light emitting device and it is preferably formed on the substrate. In this case, the anode may be formed entirely or partially on one of the surfaces of the substrate.

Patterning upon forming the anode may be conducted by chemical etching adopting photolithography, etc., or by physical etching adopting laser, etc. Further, the patterning may be conducted by vacuum vapor deposition, sputtering, etc. while stacking a mask, or by a lift-off method or a printing method.

The thickness of the anode can be selected properly depending on the material constituting the anode and, while it can not be determined generally, it is usually about from 10 nm to 50 μm and, preferably, from 50 nm to 20 nm.

The resistance value of the anode is, preferably, $10^3$ Ω/□ or less and, more preferably, $10^2$ Ω/□ or less. In a case where the anode is transparent, it may be colorless transparent or colored transparent. For taking out light emission from the side of the transparent anode, the transmittance is, preferably, 60% or higher and, more preferably, 70% or higher.

The transparent electrode is described specifically in "New Development of Transparent Electrode Film", supervised by Yutaka Sawada, published from CMC (1999) and the matters described therein can be applied to the invention. In a case of using a plastic substrate of low heat resistance, a transparent electrode using ITO or IZO and formed as a film at a low temperature of 150° C. or lower is preferred.

(Cathode)

It may usually suffice that the cathode has a function as an electrode for injecting electrons to the organic compound layer and the shape, structure, size, etc. thereof are not particularly limited and can be selected properly from known electrode materials in accordance with the application use and the purpose of the light emitting device.

The material constituting the cathode includes, for example, metals, alloys, metal oxides, electroconductive compounds, and mixtures thereof. Specific examples include alkali metals (for example, Li, Na, K, and Cs), alkaline earth metals (for example, Mg and Ca), gold, silver, lead, aluminum, sodium-potassium alloy, lithium-aluminum alloy, magnesium-silver alloy, indium, and rare earth metals such as ytterbium. They may be used alone or two or more of them can be preferably used in combination with a view point of making the stability and the electron injecting property compatible.

Among them, as the material constituting the cathode, alkali metals or alkaline earth metals are preferred in view of the electron injecting property and materials mainly comprising aluminum are preferred with a view point of excellent storage stability.

Materials mainly comprising aluminum mean aluminum per se, an alloy of aluminum and from 0.01 to 10 mass % of an alkali metal or alkaline earth metal, or a mixture thereof (for example, lithium-aluminum alloy, and magnesium-aluminum alloy).

The materials for the cathode are described specifically in JP-A Nos. 2-15595 and 5-121172 and the materials described in the publications can be applied also to the invention.

The method of forming the cathode is not particularly limited and it can be conducted in accordance with known methods. For example, the cathode can be formed in accordance with a method selected properly from wetting method such as a printing method and a coating method, physical method such as a vacuum vapor deposition method, a sputtering method or, an ion plating method, and chemical method such as a CVD or plasma CVD method while considering the adaptability with the material constituting the cathode. For example, in a case of selecting metals or the like as a material for the cathode, it can be formed in accordance with a sputtering method, etc. by sputtering one of them or plurality of them simultaneously or successively.

Patterning upon forming the cathode may be conducted by chemical etching such as photolithography, or physical etching such as by laser, or it may be conducted by vacuum vapor deposition or sputtering while stacking a mask or by a lift-off method or a printing method.

In the invention, the position for forming the cathode is not particularly limited and it may be formed entirely or partially on the organic compound layer.

Further, a dielectric layer of a fluoride or oxide of an alkali metal or alkaline earth metal may be inserted at a thickness of from 0.1 to 5 nm between the cathode and the organic compound layer. The dielectric layer can be regarded as a sort of an electron injecting layer. The dielectric layer can be formed, for example, by a vacuum vapor deposition method, a sputtering method or an ion plating method.

The thickness of the cathode can be selected properly depending on the material constituting the cathode and, while it can not be defined generally, it is usually about from 10 nm to 5 μm and, preferably, from 50 nm to 1 μm.

The cathode may be transparent or not transparent. The transparent cathode can be formed by forming a thin film of the material of the cathode to a thickness of from 1 to 10 nm and, further, laminating a transparent conductive material such as ITO or IZO.

(Organic Compound Layer)

The organic compound layer in the invention is to be described.

The organic EL device of the invention has at least one organic compound layer containing at least a light emitting layer. Other organic compound layers than the organic light emitting layer include layers such as a hole transporting layer, an electron transporting layer, a charge blocking layer, a hole injecting layer, and an electron injecting layer respectively as described above.

-Formation of Organic Compound Layer-

In the organic EL device of the invention, each of the layers constituting the organic compound layer can be formed suitably by any of a dry film forming method such as a vapor deposition method or a sputtering method, a transfer method, a printing method, etc.

-Organic Light Emitting Layer-

The organic light emitting layer is a layer having a function of accepting holes from the anode, the hole injecting layer, or the hole transporting layer and accepting electrons from the cathode, the electron injecting layer, or the electron transporting layer upon application of an electric field, and providing a site for re-combination of hole and electron to emit light.

The light emitting layer in the invention may be formed only of a light emitting material, or may be formed of a mixture of a host material and light emitting material. The light emitting material may a fluorescence emitting material or a phosphorescence emitting material and the dopant may be of one or plural kinds. The host material is preferably a charge transporting material. The host material may be of one or plural kinds and includes, for example, a mixture of an electron transporting host material and a hole transporting host material. Further, it may also contain a material not having charge transportability and not emitting light in the light emitting layer.

Further, the light emitting layer may have one or more layer and each of the layers may emit light at different emission colors.

In the invention, a light emitting device of any desired color can be obtained by using two or more kinds of light emitting materials different from each other. Among them, a white light-emitting device at high emission efficiency and high emission brightness can be obtained by properly selecting the light emitting materials. For example, white light can be emitted by using light emitting materials that emit lights of colors in a complementary relation such as blue light emission/yellow light emission or, aqua color light emission/orange light emission, green light emission/purple light emission. Further, white light emission can be obtained by using light emitting materials of blue light emission/green light emission/red light emission.

The host material may emit light also having a function of the light emitting material. For example, the device may be caused to emit white light by the emission of the host material and the emission of the light emitting material.

In the invention, two or more different kinds of light emitting materials may be contained in one identical light emitting layer. Alternatively, a structure of laminating layers containing respective light emitting materials, for example, as blue light emitting layer/green light emitting layer/red right emitting layer, or blue light emitting layer/yellow light emitting layer may be adopted.

The method of adjusting the emission color of the light emitting layer may also include the followings. The emission color can be adjusted by using one or plurality of such methods.

(1) Adjusting Method by Providing a Color Filter on the Side of Taking Out Light from the Light Emitting Layer A color filer adjusts the emission color by restricting transmitting wavelength. As the color filter, known materials may be used such as cobalt oxide for the blue filter, a mixed system of cobalt oxide and chromium oxide for the green filter, and iron oxide for the red filter, which may be formed on a transparent substrate by using known thin film forming method, for example, a vacuum vapor deposition method.

(2) A Method of Adjusting Emission Color by Addition of a Material of Promoting or Inhibiting Light Emission For example, a so-called assistant dopant of accepting energy from a host material and transferring the energy to the light emitting material can be added to facilitate energy transfer from the host material to the light emitting material. The assistant dopant is properly selected from known materials and, for example, selected sometimes from materials that can be utilized as the light emitting material or the host material to be described later.

(3) A Method of Adjusting Emission Color by Adding a Material for Converting Wavelength to the Layer (Including a Transparent Substrate) on the Side of Taking Out Light from the Light Emitting Layer As the material, known wavelength conversion material can be used and, for example, a fluorescence conversion substance of converting a light emitted from a light emitting layer to other light of low energy wavelength can be adopted. The kind of the fluorescence conversion material is properly selected in accordance with the wavelength of a light to be emitted from an aimed organic EL device and a wavelength of light emitted from the light emitting layer. Further, the amount of the fluorescence conversion substance to be used can be selected properly in accordance with the kind thereof within a range not causing density extinction. As the fluorescence conversion substance, only one kind of the substance may be used or a plurality kinds of substances may be used in combination. In a case of using plural species in combination, white light or intermediate color light can also be emitted in addition to the blue light, green light, and red light depending on the combination.

Examples of the fluorescence emitting material usable in the invention include, for example, various metal complexes typically represented by metal complexes of benzoxazole derivatives, imidazole derivatives, benzothiazole derivatives, styrylbenzene derivatives, polyphenyl derivatives, diphenyl butadiene derivatives, tetraphenyl butadiene derivatives, naphthalimide derivatives, cumarine derivatives, condensed aromatic compound, perynone derivatives, oxadiazole derivatives, oxazine derivatives, aldazine derivatives, pyralidine derivatives, cyclopentadiene derivatives, bisstyryl anthracene derivatives, quinacridone derivatives, pyrrolopyridine derivatives, thiadiazolopyridine derivatives, cyclopentadiene derivatives, styrylamine derivatives, diketopyrrolopyrole derivatives, aromatic dimethylidene compound, and 8-quinolinole derivatives, and metal complexes of pyrrometene derivatives, polymer compounds such as polythiophene, polyphenylene and polyphenylene vinylene, and compounds such as organic silane derivatives.

Further, the phosphorescence emitting materials usable in the invention includes, for example, complexes containing transition metal atoms or lanthanoide atoms.

The transition metal atoms are not particularly limited and include, preferably, ruthenium, rhodium, palladium, tungsten, rhenium, osmium, iridium, and platinum and, more preferably, rhenium, iridium and platinum.

The lanthanoide atoms include lanthanum, cerium, praseodymium, neodymium, samarium, europium, gadolinium, terbium, dysprosium, holmium, erbium, thulium, ytterbium, and lutetium. Among the lanthanoide atoms, neodymium, europium, and gadolinium are preferred.

Ligands of complexes include those ligands, described, for example, in "Comprehensive Coordination Chemistry", written by G. Wilkinson, et al., published from Pergamon Press in 1987, "Photochemistry and Photophysics of Coordination Compounds" written by H. Yersin, published from Springer-Verlag Co. in 1987, and "Organic Metal Chemistry—Foundation and Application—" written by Akio Yamamoto, published from Shokabo Co. in 1982, etc.

Specific ligands are, preferably, halogen ligands (preferably, chlorine ligand), nitrogen-containing heterocyclic ligands (for example, phenylpyridine, benzoquinoline, quinolinol, bipyridyl, and phenanthroline), diketone ligands (for example, acetylacetone), carboxylic acid ligands (for example, acetic acid ligand), carbon monoxide ligand, isonitrile ligand, and cyano ligand and, more preferably, nitrogen-containing heterocyclic ligands. The complexes described above may have one transition metal atom in the compound or may be a so-called composite nuclei complexes having two or more of them. Metal atoms of different kinds may be contained together.

The phosphorescence emitting material is contained in the light emitting layer by, preferably, from 0.1 to 40 mass % and, more preferably, from 0.5 to 20 mass %.

Further, the host materials contained in the light emitting layer in the invention include, for example, those having carbazole skeleton, having diarylamine skeleton, having pyridine skeleton, having pyrazine skeleton, having triazine skeleton, and having arylsilane skeleton, or those materials exemplified in the columns for the hole injecting layer, the hole transporting layer, the electron injecting layer and the electron transporting layer to be described later.

The thickness of the light emitting layer is not particularly limited and usually it is, preferably, from 1 nm to 500 nm, more preferably, from 5 nm to 200 nm and, further preferably, from 10 nm to 100 nm.

-Hole Injecting Layer, Hole Transporting Layer-

The hole injecting layer and the hole transporting layer are layers having a function of accepting holes from the anode or from the side of the anode and transporting them to the side of the cathode. The hole injecting layer and the hole transporting layer are preferably layers containing specifically, for example, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazene derivatives, aromatic tertiary amine compounds, styrylamine compounds, aromatic dimethylidine compounds, porphiline compounds, organic silane derivatives, and carbon.

The thickness of the hole injecting layer and the hole transporting layer is preferably each 500 nm or less with a view point of lowering the driving voltage.

The thickness of the hole transporting layer is, preferably, from 1 nm to 500 nm, more preferably, from 5 nm to 200 nm and, further preferably, from 10 nm to 100 nm. Further, the thickness of the hole injecting layer is, preferably, from 0.1 nm to 200 nm, more preferably, from 0.5 nm to 100 nm and, further preferably, from 1 nm to 100 nm.

The hole injecting layer and the hole transporting layer may be of a single layered structure comprising one or more of the materials described above or may be of a multi-layered structure comprising plural layers of an identical composition or different kinds of compositions.

-Electron Injecting Layer, Electron Transporting Layer-

The electron injecting layer and the electron transporting layer are layers having a function of accepting electron from the cathode or from the side of the cathode and transporting them to the side of the anode. The electron injecting layer and the electron transporting layer are preferably layers containing, specifically, various kinds of metal complexes typically represented by metal complexes of triazole derivatives, oxazole derivatives, oxodiazole derivatives, imidazole derivatives, fluorenone derivatives, anthraquinodimethane derivatives, anthron derivatives, diphenylquinone derivatives, thiopyrane dioxide derivatives, carbodiimide derivatives, fluorenylidene methane derivatives, distyrylpyradine derivatives, aromatic ring tetracarboxylic acid anhydrides such as naphthalene and perylene, phthalocyanine derivatives, and 8-quinolinole derivatives, and metal complex having metal phthalocyanine, benzoxazole, or benzothiazole as the ligand, organic silane derivatives, etc.

The thickness of the electron injecting layer and the electron transporting layer is preferably each from 500 nm or less respectively with a view point of lowering the driving voltage.

The thickness of the electron transporting layer is, preferably, from 1 nm to 500 nm, more preferably, from 5 nm to 200 nm and, further preferably, from 10 nm to 100 nm. Further, the thickness of the electron injecting layer is, preferably, from 0.1 nm to 200 nm, more preferably, from 0.2 nm to 100 nm and, further preferably, from 0.5 nm to 50 nm.

The electron injecting layer and the electron transporting layer may be of a single layered structure comprising one or more of the materials described above or a multi-layered structure comprising plural layers each of an identical composition or different kinds of compositions.

Further, for moderating the energy barrier between the cathode and the light emitting layer, an alkali metal or an alkali metal compound may be doped to the layer adjacent the cathode. Since the organic layer is reduced by the added metal or metal compound to form anions, the electron injecting property is enhanced and the application voltage is lowered. The alkali metal compound includes, for example, oxides, fluorides and lithium chelates.

-Hole Blocking Layer-

The hole blocking layer is a layer having a function of preventing holes transported from the anode to the light emitting layer from passing through to the side of the cathode. In the invention, the hole blocking layer can be provided as an organic compound layer adjacent with the light emitting layer on the side of the cathode. The electron transporting layer or the electron injecting layer may also have a function of the hole blocking layer.

Examples of the organic compound constituting the hole blocking layer include aluminum complexes such as $BAl_q$, triazole derivatives, and phenanthroline derivatives such as BCP.

The thickness of the hole blocking layer is, preferably, from 1 nm to 500 nm, more preferably, 5 nm to 200 nm and, further preferably, from 10 nm to 100 nm.

The hole blocking layer may be of a single layered structure comprising one or more kinds of the materials described above or a multi-layered structure comprising plural layers each of an identical composition or different kinds of compositions.

Further, a layer having a function of preventing electrons transported from the side of the cathode to the light emitting layer from passing through to the side of the anode may also be situated at a position adjacent with the light emitting layer on the side of the anode. The hole transporting layer or the hole injecting layer may also have such function together.

(Protective Layer)

In the invention, the entire organic EL device may be protected by a protective layer.

The material contained in the protective layer may be any material of suppressing intrusion of moisture or oxygen into the device that promotes deterioration of the device.

Specific examples include metals such as In, Sn, Pb, Au; Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal nitrides such as $SiN_x$, $SiN_xO_y$, metal fluorides such as $MgF_2$, LiF, $AlF_3$, and $CaF_2$, polyethylene, polypropylene, polymethylmethacrylate, polyimide, polyurea, polytetrafluoroethylene, polychlorotrifluoroethylene, polydichlorodifluoroethylene, copolymer of chlorotrifluoroethylene and dichlorofluouroethylene, a copolymer obtained by copolymerizing tetrafluoroethylene and a monomer mixture containing at least one comonomer, a fluoro-containing copolymer having a cyclic structures in the copolymerization main chain, water absorbing material with a water absorptivity of 1% or more, and a moisture proofing material with a water absorptivity of 0.1% or less.

The method of forming the protective layer is not particularly limited and, for example, a vacuum vapor deposition method, a sputtering method, a reactive sputtering method, an MBE (Molecular Beam Epitaxy) method, a cluster ion beam method, an ion plating method, a plasma polymerization method (RF-excited ion plating method), a plasma CVD method, a laser CVDmethod, a thermal CVDmethod, a gas source CVD method, a coating method, a printing method, or a transfer method can be applied.

(Sealing)

Further, the organic EL device of the invention may be sealed for the entire device by using a sealing vessel.

Further, a water absorbent or an inert liquid may be sealed in a space between the sealing vessel and the light emitting device. The water absorbent is not particularly limited and includes, for example, barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited and includes, for example, paraffins, liquid paraffins, fluoro-solvents such as perfluoro alkanes or perfluoro amines and perfluoro ethers, chloro-solvents, and silicone oils.

Light emission can be obtained from the organic EL device of the invention by applying a DC (may optionally containing AC component) voltage (usually from 2 to 15 V), or a DC current between the anode and the cathode.

For the driving method of the organic EL device of the invention, a driving method described in each of the publications of JP-ANos. 2-148867, 6-301355, 5-29080, 7-134558, 8-234685 and 8-241047, and in each of the specifications of JP No. 2784615, and U.S. Pat. Nos. 5,828,429 and 6,023,308 can be applied.

In a case of using the gas barrier film of the invention for the organic EL device, it may be used as a substrate film and/or protective film.

Further, the gas barrier laminate disposed on the substrate film of the invention may also be disposed on the device described above instead of the substrate film and may be sealed.

The present invention will be further specifically explained with reference to the following examples of the present invention. The materials, amounts, ratios, types and procedures of treatments and so forth shown in the following examples can be suitably changed unless such changes depart from the gist of the present invention. Accordingly, the scope of the present invention should not be construed as limited to the following specific examples.

EXAMPLE 1

Gas barrier films each formed by disposing a gas barrier laminate on a substrate film and a transparent conductive layer thereon (Sample Nos. 1 to 21) were prepared in accordance with the following procedures. Details for the structure of each of the gas barrier films are as described in Table 1 and Table 2.

<Preparation of Gas Barrier Films of the Invention (Samples Nos. 1 to 17)>

(1) Preparation of Substrate Film

Substrate films of 100 μm thickness comprising resins described in Table 1 were provided. In Table 1, Lumilar T60 manufactured by Toray Co. was used as PET, and Teonex Q65AF manufactured by Teijin Dupont Film Co. was used as PEN. Further, the substrate films used for Samples Nos. 8 to 14 were prepared from the resins as the starting materials by the following method.

The resin was dissolved in a dichloromethane solution such that the concentration was 15 mass % and the solution was cast by a die coating method over a stainless steel band. Then, the first film was peeled from the band and dried till the residual solvent concentration was 0.08 mass %. After drying, both ends of the first film were trimmed, applied with knurling fabrication and then taken-up to prepare a substrate film of 100 μm thickness.

(2) Formation of Gas Barrier Laminate

Figure 1:
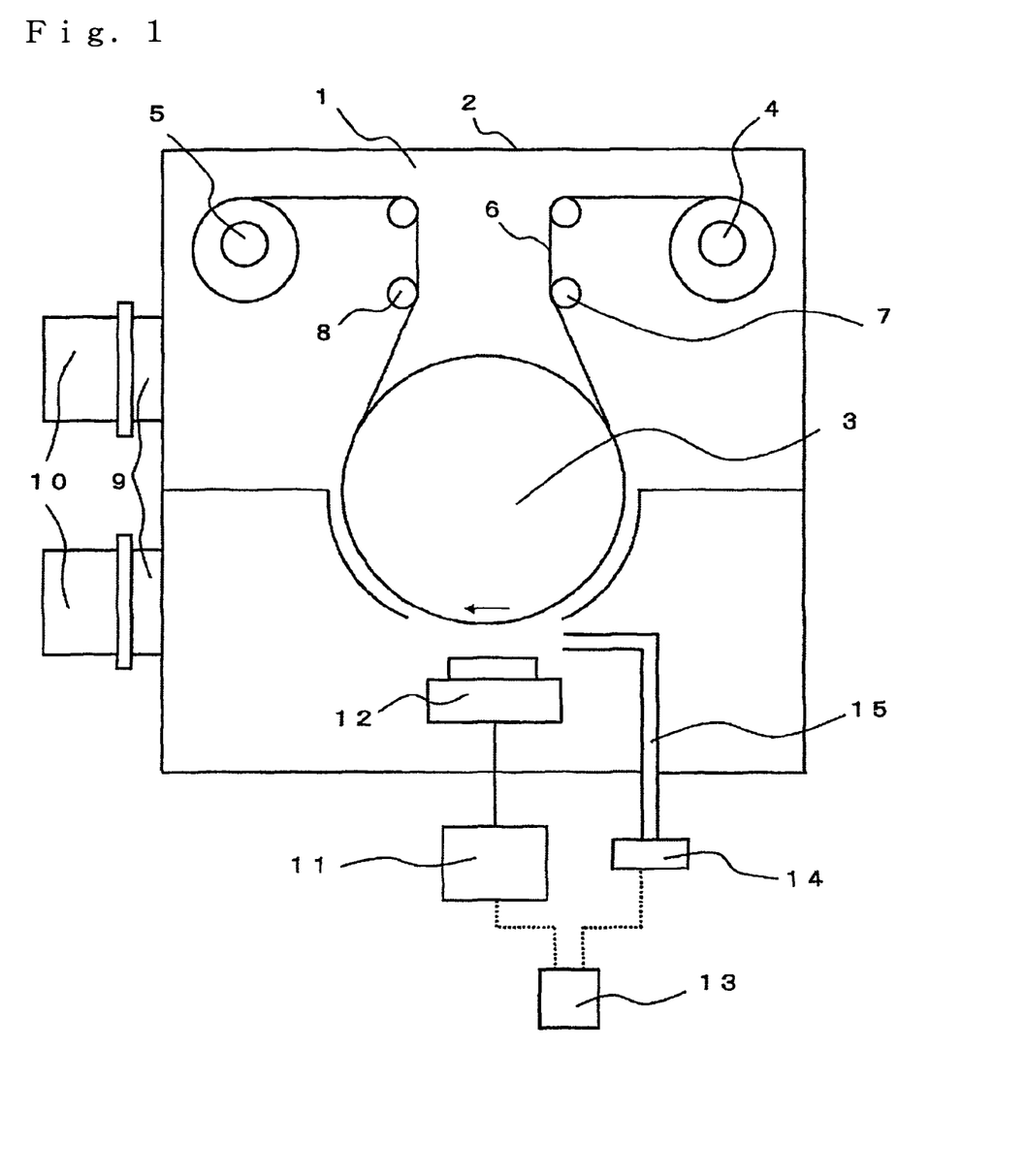
FIG. 1 is an explanatory view showing an inductively-coupled plasma CVD apparatus used for manufacturing of Samples Nos. 1 to 20.

An inorganic gas barrier layer was formed on a substrate film by using a roll-to-roll system inductively-coupled plasma CVD apparatus (1). As shown in FIG. 1, the inductively-coupled plasms CVD apparatus (1) has a vacuum vessel (2), in which a drum (3) is located at a central portion thereof for cooling a plastic film (6) by contact at the surface. A delivery roll (4) and a take-up roll (5) for winding the plastic film (6) are arranged in the vacuum vessel (2). The plastic film (6) wound around the delivery roll (4) is wound by way of a guide roll (7) to the drum (3) and, further, the plastic film (6) is wound byway of the guide roll (8) to the take-up roll (5). In a vacuum exhaustion system, the inside of the vacuum vessel (2) is always exhausted by a vacuum pump (10) from exhaust ports (9). The film forming system comprises an RF power source (11) having induction coils for generating induction electric fields connected with an auto-matcher and a gas introduction system by a mass flow controller for introducing a gas at a predetermined flow rate from a reservoir to the vacuum vessel.

Specific conditions during formation of the gas barrier laminate are shown below.

The substrate film was disposed as the plastic film (6), which was put on the delivery roll (4) and passed as far as the take-up roll (5). After completing the preparation of the substrate to the inductively-coupled plasma CVD apparatus (1), a door for the vacuum vessel (2) was closed, the vacuum pump (10) was actuated and evacuation was started. When the pressure reached $4 \times 10^{-4}$ Pa, running of the plastic film (6) was started. Argon was introduced as the discharge gas and the discharging power source (11) was turned-ON and RF at 13.56 MHz was applied at a discharging power of 500 W to generate plasmas in the vacuum vessel under a film forming pressure described in Table 1 and Table 3 and plasma cleaning treatment was conducted for 5 min. Then, a silane gas diluted to 5% with nitrogen was introduced as a reaction gas and, after confirming the stabilization of discharge under the film forming pressure, the film transporting direction was reversed and formation of a silicon nitride film was conducted for a certain time after completing the film formation, an oxygen gas was introduced slowly and, after confirming the stabilization of discharge, the film was transported in the direction opposite to that described above to form a film of silicon oxynitride. In this case, the flow rates of the silane gas diluted to 5% with nitrogen and the oxygen gas were as described in Table 1 and Table 3. Then, introduction of oxygen was interrupted and, after confirming the stabilization of discharge, the film was transported again in the opposite direction to form a film of the silicon nitride layer.

(3) Formation of Transparent Conductive Layer

The samples obtained as described above were introduced into a vacuum chamber of a commercially available batch type magnetron sputtering apparatus (manufactured by Shibaura Mechatronics Co.), and anode of indium tin oxide (ITO, indium/tin=95/5 molar ratio) was formed (0.2 μm thickness) by using a DC power source.

As described above, the gas barrier films of the invention (Samples Nos. 1 to 17) were obtained.

<Preparation of Gas Barrier Films for Comparison (Sample No. 18)>

A gas barrier film for comparison (Sample No. 18) was prepared quite in the same manner as in the manufacturing steps for the Sample No. 2 except for not conducting the step of forming the silicon oxynitride layer in the preparation step for the Sample No. 2.

<Preparation of Gas Barrier Films for Comparison (Sample No. 19)>

A commercially available batch type magnetron sputtering apparatus (manufactured by Shibaura Mechatronics Co.) was used. The same substrate film as used for the preparation in Sample No. 2 (PEN film) was evacuated to the order of $10^{-4}$ Pa, and argon was introduced as a discharging gas at a partial pressure of 0.5 Pa. When the atmospheric pressure was stabilized, discharge was started to generate plasmas on an $Si_3N_4$ target and the sputtering process was started. When the process was stabilized, the shutter was opened to start formation of a first silicon oxynitride layer to the film. When a film of 5 nm was deposited, the shutter was closed to complete the film formation. When the elemental ratio in the silicon oxynitride layer formed under the conditions was measured by X-ray photoelectron spectroscopy (ESCA), it was at: O/N=30/70. Successively, argon was introduced as a discharging gas at a partial pressure of 0.5 Pa and oxygen was introduced as a reaction gas at a partial pressure of 0.005 Pa. When the atmospheric pressure was stabilized, discharge was started to generate plasmas on the $Si_3N_4$ target and the sputtering process was started. When the process was stabilized, the shutter was opened to start formation of a second silicon oxynitride layer. When the film was deposited to 95 nm, the shutter was closed to complete the film formation. When the elemental ratio in the second silicon oxynitride layer formed under the conditions was measured by ESCA, it was at: O/N=65/35. Atmospheric air was introduced in the vacuum vessel and a film formed with the silicon oxynitride layer was taken out.

Then, a gas barrier film for comparison (Sample No. 19) was obtained by applying the step of forming the transparent conductive layer practiced in the preparation of Sample No. 2 described above to the sample.

<Preparation of Gas Barrier Films for Comparison (Sample No. 20)>

A comparative gas barrier film (Sample No. 25) was prepared quite in the same manner as in the preparation step for Sample No. 2 except for not practicing the step of forming the silicon nitride layer nearer to the substrate film in the preparation step for Sample No. 2.

<Preparation of Gas Barrier Film for Comparison (Sample No. 21)>

1. Formation of Inorganic Layer

Figure 2:
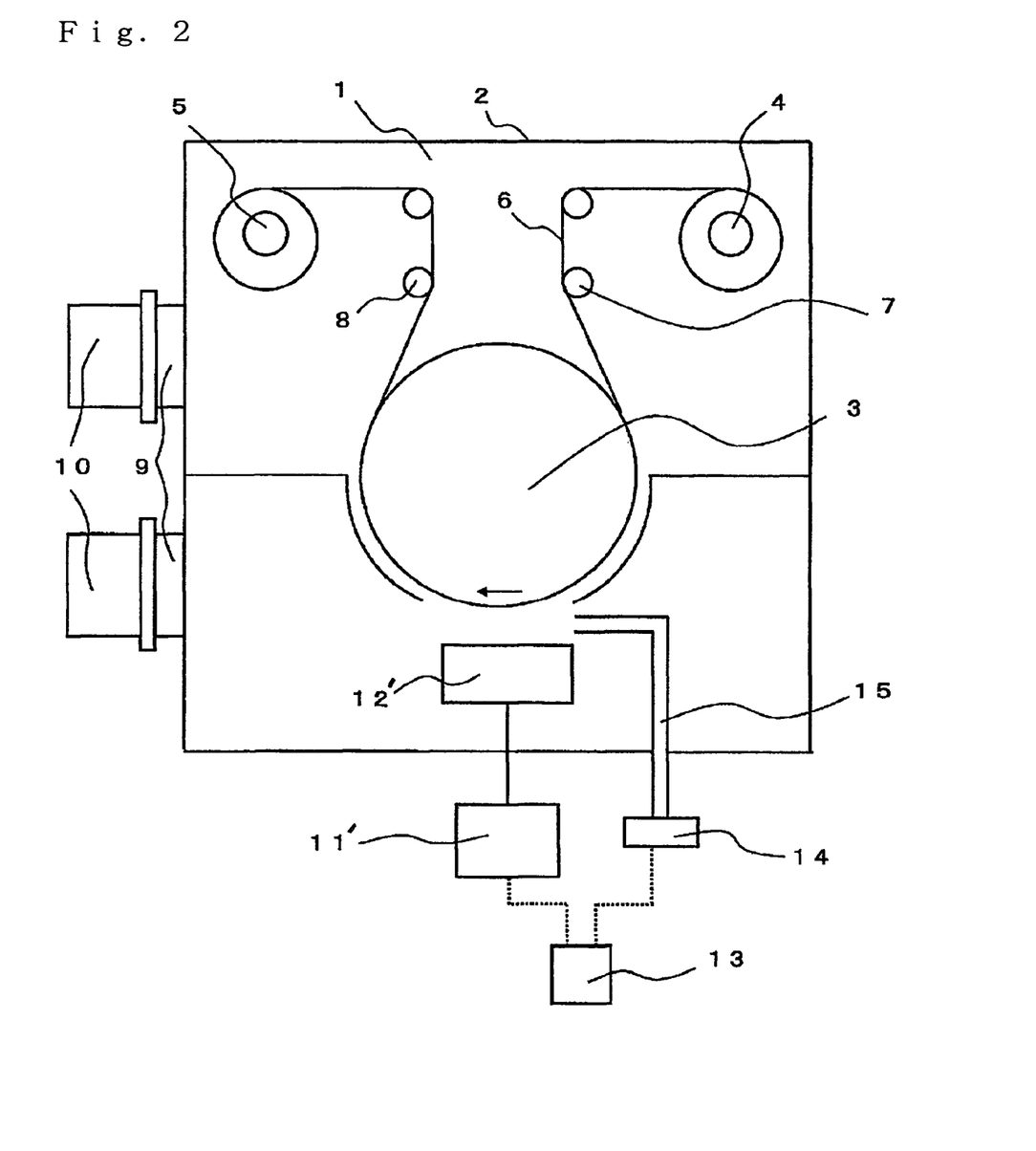
FIG. 2 is an explanatory view showing a sputtering apparatus used for manufacturing Samples No. 21.

A roll-to-roll system sputtering apparatus (1) as shown in FIG. 2 similar with that of FIG. 1 was used. The apparatus has a vacuum vessel (2) in which a drum (3) is located at a central portion thereof for cooling a plastic film (6) by contact at the surface. A delivery roll (4) and a take-up roll (5) for winding the plastic film (6) are arranged in the vacuum vessel (2). The plastic film (6) wound around the delivery roll (4) is wound by way of a guide roll (7) to the drum (3) and, further, the plastic film (6) is wound by way of the guide roll (8) to the take-up roll (5). In a vacuum exhaustion system, the inside of the vacuum vessel (2) is always exhausted by a vacuum pump (10) from exhaust ports (9). As the film formation system, a target (not illustrated) is mounted on a cathode (12') connected to a DC system discharge power source (11') that can supply pulsed power. The discharge power source (11') is connected to a controller (13) and, further, the controller (13) is connected to the gas flow rate control unit (14) for supplying the gas while controlling the amount of the reaction gas introduced by way of a pipeline (15) to the vacuum vessel (2). Further, it is adapted such that a discharge gas at a predetermined flow rate is supplied to the vacuum vessel (2) (not illustrated). Specific conditions are shown below.

Si was set as a target, and a pulse application type DC power source was provided as the discharging power source (11'). The same substrate film (PEN film) as used for the preparation of Sample No. 2 was provided as the plastic film (6), which was put on the delivery roll (4) and passed as far as the take-up roll (5). After completing the preparation of the substrate to the sputtering apparatus (1), a door for the vacuum vessel (2) was closed and the vacuum pump (10) was actuated and evacuation and the drum cooling were started. When the pressure reached $4 \times 10^{-4}$ Pa and the drum temperature was cooled to 5° C., running of the plastic film (6) was started. Argon was introduced as the discharging gas and the discharging power source (11') was turned-ON to generate plasmas above the Si target with a discharging power of 5 KW and a film-forming pressure of 0.3 Pa, and pre-sputtering was conducted for 3 min. Subsequently, oxygen was introduced as a reaction gas and the amount of argon and oxygen gas was gradually decreased to lower the film-forming pressure to 0.1 Pa after the discharging was stabilized. After confirming the stabilization of discharging at 0.1 Pa, formation of a silicon oxide film was conducted for a predetermined time. After completing the film formation, inside of the vacuum vessel (2) was returned to the atmospheric pressure and a film deposited with silicon oxide was taken out. The thickness was about 20 nm.

2. Formation of Organic Layer

Then, an acrylic monomer mixture of 50.75 mL of tetraethylene glycol diacrylate, 14.5 mL of tripropylene glycol monoacrulate, 7.25 mL of caprolacton acrylate, 10.15 mL of acrylic acid, and 10.15 mL of "EZACURE" (photopolymerization initiator of benzophenone mixture manufactured by Sartomer Co.) was mixed with 36.25 g of solid N,N'-bis(3-methylphenyl)-N,N'-diphenylbenzidine particles, and stirred for about one hour by a supersonic tissue mincer at 20 kHz. They were heated to about 45° C. and the mixture stirred for preventing settling was sent by a pump through a capillary of 2.0 mm inner diameter and 61 mm length to a 1.3 mm spray nozzle. Then, it was sprayed as fine droplets by a supersonic sprayer at 25 kHz and dropped to the surface maintained at about 340° C. Then, after cryogenically condensing steams on the substrate film in contact with a low temperature drum at a temperature of about 13° C., it was UV-cured by a high pressure mercury lamp (accumulated amount of irradiation: about 2000 mJ/cm$^2$) to form an organic layer. The film thickness was about 500 nm.

3. Alternate Repetitive Film Formation of Inorganic Layer Formation/organic Layer Formation A gas barrier laminate was prepared by repeating the procedures (1) and (2) above each by three times, and an inorganic layer ($SiO_x$ layer) was disposed on the uppermost layer (9 layers in total).

A gas barrier film for comparison (Sample No. 21) was obtained by applying the step of forming the conductive transparent layer practiced in the preparation of Sample No. 8 described above to the sample.

<Evaluation for Physical Property of Barrier Film>

The physical properties of the barrier film were evaluated using the following apparatus.

Layer constitution (film thickness): scanning type electron microscope "model S-900", manufactured by Hitachi Ltd.

Steam permeability (g/m$^2$/day): "PERMATRAN-W3/31", manufactured by MOCON Co. (condition: 40° C. 90% RH)

Atom compositional ratio: "ESCA 3400", manufactured by Claitos Analytical Co.

Refractive index: "WOOLLAM-VASE", manufactured by J. A. Woollam Japan Co.

EXAMPLE 2

<Manufacture of Organic EL Device (I)>

An anode of an indium tin oxide (ITO, indium/tin=95/5 molar ratio) was formed on a gas barrier film of 25 mm×25 mm (Samples Nos. 1 to 21) using a DC power source by a sputtering method (0.2 μm thickness). Copper phthalocyanine (CuPc) was formed as a hole injecting layer to 10 nm on the anode by a vacuum vapor deposition method, on which N,N'-dinaphthyl-N,N'-diphenyl benzidine was formed as the hole transporting layer to 40 nm by a vacuum vapor deposition method. 4,4'-N,N'-diarbazole biphenyl was formed thereon as the host material, bis[(4,6-difluorophenyl)-pyridinate-N, C2'] (picolinate) iridium complex (Firpic) as the blue color emitting material, tris(2-phenylpyridine) iridium complex (Ir(ppy)$_3$) as the green color emitting material and bis(2-phenylquinoline) acetyl acetonate iridium as the red light emitting material were co-vapor deposited to at a weight ratio of 100/2/4/2 respectively, to obtain a light emitting layer of 40 nm. Further, 2,2',2"-(1,3,5-benzene toluyl)tris[3-(2-methylphenyl)-3H-imidazo[4,5-b]pyridine] was vapor deposited as the electron transporting material thereon at a rate of 1 nm/sec to form an electron transporting layer of 24 nm. A patterned mask (a mask providing a light emission area of 5 mm×5 mm) was placed on the organic compound layer, and lithium fluoride was vapor deposited to 1 nm and, further, aluminum was vapor deposited to 100 nm in a vapor deposition apparatus to form a cathode. Aluminum lead wires were led out of the anode and the cathode respectively to prepare a light emitting device. The device was placed in a globe box replaced with a nitrogen gas sealed with a glass cap and UV-ray curable adhesive (XNR5493, manufactured by Nagase Chiba) to manufacture a light emitting device.

<Manufacture of Organic EL Device (II)>

A light emitting devices were manufactured in the same manner as in the manufacture (I) of the organic EL device by using gas barrier films (Sample Nos. 1 to 21) and the following step was practiced before sealing.

After introducing the device into the apparatus shown in FIG. 1 (secured to a guide base with a capton tape) and depressurizing to $10^{-4}$ Pa, a silane gas diluted to 5% with nitrogen was introduced as a reaction gas and, after confirming the stabilization of discharge at 0.6 Pa, the film transporting direction was reversed and film formation of the silicon nitride was conducted for a predetermined time. After completing the film formation, an oxygen gas corresponding to 5% of the flow rate of the nitrogen-diluted silane was introduced slowly and, after confirming the stabilization of discharge, the film was transported in the direction opposite to the previous case and a silicon oxynitride film was formed. Then, introduction of oxygen was interrupted and, after confirming the stabilization of discharge, the film was again transported in the opposite direction to form a film of a silicon nitride layer. When a thermo tape was adhered to the same sample for reference and the process temperature was confirmed, it was lower than 50° C.

<Evaluation for the Durability of Organic EL Devices (I), (II)>

When a DC current was applied to the obtained organic EL devices (I), (II) using a source measure unit model 2400 (manufactured by Toyo Technica Co.) to emit light, each of the devices emitted light satisfactorily.

Then, after preparing the organic EL device described above, it was left at 60° C./90% RH for 500 hours to emit light in the same manner, and the area of the light emitting portion for the entire device (not-light emitting portion: dark spots) was determined by using a micro analyzer manufactured by Nippon Poladigital Co.

Results of Examples 1 and 2 are collectively shown in Table 1 below.

TABLE 1

| Sample No. | Substrate film Kind | Constituent resin | Glass transition temperature (° C.) | Structure | Silicon oxynitride layer Film forming condition | Silicon oxynitride layer Oxygen/nitrogen composition ratio | Refractive index of silicon oxynitride layer (633 nm) | Steam permeability (g/m²·d) | Emission area ratio of organic EL device, after elapse of 500 hours at 60° C., 90% RH Organic EL device (I) | Organic EL device (II) | Number of windings in sample preparation | Remarks |
|---|---|---|---|---|---|---|---|---|---|---|---|---|
| 1 | a | PET | 77 | A | i | 3.1 | 1.55 | <0.01(*) | 63% | 62% | 3 times | Invention |
| 2 | b | PEN | 121 | A | i | 3.1 | 1.58 | <0.01(*) | 94% | 91% | 3 times | Invention |
| 3 | b | PEN | 121 | A | ii | 3.1 | 1.95 | <0.01(*) | 85% | 82% | 3 times | Invention |
| 4 | b | PEN | 121 | A | iii | 1.2 | 1.92 | <0.01(*) | 86% | 83% | 3 times | Invention |
| 5 | b | PEN | 121 | A | iv | 19.5 | 1.51 | <0.01(*) | 88% | 87% | 3 times | Invention |
| 6 | b | PEN | 121 | A | v | 3.2 | 1.42 | <0.01(*) | 92% | 90% | 3 times | Invention |
| 7 | b | PEN | 121 | A | vi | 18.5 | 1.93 | <0.01(*) | 91% | 90% | 3 times | Invention |
| 8 | c | 1-1 | 224 | A | i | 3.0 | 1.55 | <0.01(*) | 96% | 94% | 3 times | Invention |
| 9 | d | 1-5 | 214 | A | i | 3.1 | 1.56 | <0.01(*) | 95% | 94% | 3 times | Invention |
| 10 | e | F-3 | 279 | A | i | 3.2 | 1.55 | <0.01(*) | 98% | 98% | 3 times | Invention |
| 11 | f | H-8 | 280 | A | i | 3.1 | 1.56 | <0.01(*) | 98% | 97% | 3 times | Invention |
| 12 | g | FL-1 | 324 | A | i | 3.1 | 1.56 | <0.01(*) | 100% | 100% | 3 times | Invention |
| 13 | g | FL-1 | 324 | A | iv | 18.3 | 1.51 | <0.01(*) | 98% | 93% | 3 times | Invention |
| 14 | g | FL-1 | 324 | A | v | 3.1 | 1.43 | <0.01(*) | 96% | 95% | 3 times | Invention |
| 15 | b | PEN | 121 | A | vii | 3.1 | 1.37 | <0.01(*) | 52% | 63% | 3 times | Invention |
| 16 | b | PEN | 121 | A | viii | 3.1 | 2.08 | <0.01(*) | 22% | 19% | 3 times | Invention |
| 17 | b | PEN | 121 | A | ix | 0.9 | 1.58 | <0.01(*) | 32% | 26% | 3 times | Invention |
| 18 | b | PEN | 121 | B | — | — | — | <0.01(*) | 13% | no emission | Twice | Com. Example |
| 19 | b | PEN | 121 | C | — | — | — | 0.08 | 15% | no emission | Twice | Com. Example |
| 20 | b | PEN | 121 | D | i | 3.1 | 1.57 | <0.01(*) | 18% | no emission | Twice | Com. Example |
| 21 | b | PEN | 121 | D | — | — | — | <0.01(*) | 92% | 88% | 5 times | Com. Example |

(*)less than detection limit

TABLE 2

| Structure | Content of structure: ( ) shows thickness |
|---|---|
| A | Substrate film/SiN$_x$ (100 nm)/SiO$_y$N$_z$ (500 nm)/SiN$_x$ (100 nm) |
| B | Substrate film/SiN$_x$(100 nm)/SiN$_x$(100 nm) |
| C | Substrate film/SiO$_y$N$_x$(O:N = 30:70.5 nm)/ SiO$_y$N$_z$(O:N = 65:35.95 nm) |
| D | Substrate film/SiN$_x$(500 nm)/SiN$_x$(100 nm) |
| E | Substrate film/{SiO$_x$ (50 nm)/organic layer (500 μm)} × 4/SiO$_x$ (500 nm) |

*"SiN$_x$", "SiO$_y$N$_z$" each represents silicon nitride and silicon oxynitride.

TABLE 3

| Silicon oxynitride layer: film forming condition | Silane gas (5% N$_2$ dilution): flow rate [sccm] | Oxygen gas: flow rate [sccm] | Film forming pressure [Pa] |
|---|---|---|---|
| i | 200 | 10 | 0.6 |
| ii | 200 | 10 | 1.0 |
| iii | 200 | 5 | 0.6 |
| iv | 200 | 20 | 0.6 |
| v | 200 | 10 | 0.3 |

TABLE 3-continued

| Silicon oxynitride layer: film forming condition | Silane gas (5% N$_2$ dilution): flow rate [sccm] | Oxygen gas: flow rate [sccm] | Film forming pressure [Pa] |
|---|---|---|---|
| vi | 200 | 20 | 1.0 |
| vii | 200 | 10 | 0.2 |
| viii | 200 | 10 | 1.2 |
| ix | 300 | 10 | 0.6 |

As apparent from the result of Table 1, the gas barrier film of the invention (Samples Nos. 1 to 17) can provide highly durable organic electrolumiscence device compared with gas barrier films for comparison (Samples Nos. 18 to 20).

Further, Samples Nos. 2, 8 to 12 manufactured under the same processing conditions using film substrates comprising constituent resins having higher glass transition temperature can provide organic electroluminescence devices of higher durability, when compared with Sample No. 1. Further, among them, Samples Nos. 8 to 14 using substrate films comprising resins having specified spiro structures or polymers having specified cardo structures described in the invention can provide organic electroluminescence devices of further higher durability.

Further, Samples Nos. 2 to 7 satisfying the conditions that the constitutional ratio between oxygen and nitrogen in the silicon oxynitride layer is from 1:1 to 20:1 and the refractive index is from 1.4 to 2.0 can provide organic electroluminescence devices of further higher durability, when compared with Samples Nos. 15 to 17.

On the other hand, the gas barrier films (Samples Nos. 1 to 17) of the invention can remarkably decrease the number of roll windings during manufacture, when compared with the gas barrier film (Sample No. 21) for comparison. That is, the invention can provide a film of higher gas barrier property by the manufacturing method at high productivity.

Since the gas barrier film of the invention has excellent transparency and gas barrier property, it can be used suitably as substrates for various kinds of devices and coating films for devices. Further, the substrate for use in the image display device and the organic EL device of the invention have high durability and flexibility. Accordingly, the invention has high industrial applicability.

The present disclosure relates to the subject matter contained in Japanese Patent Application No. 082555/2005 filed on Mar. 22, 2005, which is expressly incorporated herein by reference in its entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier film comprising a gas barrier laminate on a substrate film, wherein the gas barrier laminate comprises at least one three-layer unit consisting of a first silicon nitride layer, a silicon oxynitride layer directly on the first silicon nitride layer, and a second silicon nitride layer directly on the silicon oxynitride layer,
wherein:
at least one of the silicon nitride layers comprises 98 mass % or more of silicon and nitrogen combined; and
the silicon oxynitride layer comprises 98 mass % or more of silicon, nitrogen and oxygen combined.

2. The gas barrier film according to claim 1, wherein the steam permeability at 40° C. and 90% relative humidity is 0.01 g/m$^2$/day or less.

3. The gas barrier film according to claim 1, wherein the substrate film is formed of a polymeric material having a glass transition temperature of 120° C. or higher.

4. The gas barrier film according to claim 1, wherein at least one of the silicon nitride layer is formed by using inductively-coupled plasma CVD.

5. The gas barrier film according to claim 1, wherein the silicon oxynitride layer has a constitutional ratio between oxygen and nitrogen of 1:1 to 20:1, and a refractive index of from 1.4 to 2.0.

6. The gas barrier film according to claim 1, wherein the substrate film comprises a polymer having the structure represented by the following formula (1) or a polymer having the structure represented by the following formula (2):

Formula (1)

wherein a ring α represents a mononuclear or polynuclear ring and two rings α may be identical or different with each other and are bonded by spiro bonding, Formula (2)

wherein a ring β and a ring γ each represents a mononuclear or polynuclear ring, two rings γ may be identical or different with each other and connected to one quaternary carbon on the ring γ.

7. The gas barrier film according to claim 1, wherein a transparent conductive layer is disposed on the gas barrier laminate.

8. The gas barrier film according to claim 1, manufactured by supplying the substrate film in a roll-to-roll system and forming the gas barrier laminate continuously.

9. A substrate film for use in an image display device using the gas barrier film according to claim 1.

10. An organic electroluminescence device using the substrate film according to claim 9.

11. The organic electroluminescence device manufactured by forming the film of the organic electroluminescence device according to claim 10, then disposing on the film at least one three-layer unit consisting of a silicon nitride layer, a silicon oxynitride layer adjacent to the silicon nitride layer, and a silicon nitride layer adjacent to the silicon oxynitride layer in vacuum without exposing to atmospheric air, and then sealing the produced film.

12. A gas barrier film comprising a gas barrier laminate on a substrate film, wherein the gas barrier laminate comprises at least one three-layer unit consisting of a first silicon nitride layer, a silicon oxynitride layer directly on the first silicon nitride layer, and a second silicon nitride layer directly on the silicon oxynitride layer,
wherein the substrate film is formed of a polymeric material having a glass transition temperature of 120° C. or higher, and
wherein the silicon oxynitride layer has a constitutional ratio between oxygen and nitrogen of 1:1 to 20:1, and a refractive index of from 1.4 to 2.0.

* * * * *